(12) United States Patent  
Higashi

(10) Patent No.: US 7,790,594 B2
(45) Date of Patent: Sep. 7, 2010

(54) ELECTRONIC PART AND METHOD OF PRODUCING THE SAME

(75) Inventor: Kazushi Higashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/274,768

(22) Filed: Nov. 20, 2008

(65) Prior Publication Data

US 2009/0140410 A1 Jun. 4, 2009

(30) Foreign Application Priority Data

Dec. 4, 2007 (JP) ............................. 2007-312940

(51) Int. Cl.
*H01L 23/52* (2006.01)
(52) U.S. Cl. .................. 438/610; 257/E23.061; 438/108
(58) Field of Classification Search .......... 257/737, 257/738, 778, 690, E23.061; 438/613, 614, 438/615, 616, 617, 106, 108, 109, 127, 597, 438/610, 666
See application file for complete search history.

(56) References Cited

U.S. PATENT DOCUMENTS

| 5,545,589 | A | 8/1996 | Tomura et al. ............. 437/183 |
| 6,088,236 | A | 7/2000 | Tomura et al. ............. 361/783 |
| 6,573,458 | B1 * | 6/2003 | Matsubara et al. .......... 174/260 |
| 6,849,953 | B2 * | 2/2005 | Smith ......................... 257/778 |
| 7,272,974 | B2 * | 9/2007 | Goto ......................... 73/514.32 |
| 2007/0152025 | A1 | 7/2007 | Fujimoto et al. ....... 228/180.22 |

FOREIGN PATENT DOCUMENTS

| JP | 06-151507 | 5/1994 |
| JP | 06-283537 | 10/1994 |
| JP | 2001-274201 | 10/2001 |

* cited by examiner

*Primary Examiner*—Roy K Potter
(74) *Attorney, Agent, or Firm*—Steptoe & Johnson LLP

(57) ABSTRACT

It is an object of the invention to provide an electronic part capable of forming an accurate gap between opposing substrates while also capable of decreasing the area of the electronic part, and a method of producing the same. A second electrode portion (6), having a core pattern (7) and a bump pattern (8) covering the surface thereof, is provided on a device substrate (1), the core pattern (7) is made of a material having hardness greater than that of the bump pattern (8), a first electrode portion (5) of the same material as the bump pattern (8) is provided on a bonding substrate (2), and a functional portion of the device substrate (1) and the first electrode portion (5) are electrically connected by direct bonding of the first electrode portion (5) and the bump pattern (8).

12 Claims, 10 Drawing Sheets

ELECTRONIC PART AND METHOD OF PRODUCING THE SAME

BACKGROUND OF THE INVENTION

1. Field of the Invention

The present invention relates to an electronic part such as various types of sensors requiring an electrical connection between both opposing substrates and accurate gaps therebetween.

2. Description of the Related Art

In Japanese Patent Application Laid-open No. H3-239940, in the case of mounting a glass substrate 22 on a silicon substrate 21 at a predetermined gap d as shown in FIG. 10, a gap-setting member 24 having a thickness equal to the target gap d is provided bonded separately from a bonding layer 23 that bonds the silicon substrate 21 and the glass substrate 22.

However, in the case of employing the configuration of FIG. 10 for an electronic part, the bonding layer 23 is a low melting point glass-based or chemical-based adhesive, and since an electrical connection cannot be made in the portion of bonding layer 23, it is necessary to form a terminal for making an electrical connection at a different location from the bonding layer 23, thereby increasing the area of the electronic part.

SUMMARY OF THE INVENTION

In addition, since the processes for forming the bonding layer 23 and gap-setting member 24 differ, there is also the problem of increased production cost.

In order to solve the above problems of the prior art, an object of the present invention is to provide an electronic part capable of forming an accurate gap between opposing substrates while also capable of decreasing the area of the electronic part, and a method of producing the same.

The electronic part of the present invention is an electronic part in which a bonding substrate is bonded to a device substrate formed with a functional portion so as to cover the device substrate while forming a gap therebetween, wherein a second electrode portion is provided on either one of the device substrate and the bonding substrate, the second electrode portion contacting a first electrode portion of the other substrate, a core pattern protruding from the one substrate towards the other substrate and a bump pattern that covers the surface of the core pattern are provided in the second electrode portion, the core pattern is made of a material having hardness greater than that of the bump pattern, and the first electrode portion and the second electrode portion are electrically connected by direct bonding of the first electrode portion and the bump pattern.

In addition, the electronic part of the present invention is an electronic part in which a bonding substrate is bonded to a device substrate formed with a functional portion so as to cover the device substrate while forming a gap therebetween, wherein a second electrode portion is provided on either one of the device substrate and the bonding substrate, the second electrode portion contacting a first electrode portion of the other substrate, a core pattern protruding from the one substrate towards the other substrate and a molten metal serving as a bump pattern that covers the surface of the core pattern are provided in the second electrode portion, the core pattern is made of a material having hardness greater than that of the molten metal, and the first electrode portion and the second electrode portion are electrically connected by solidifying the molten metal after pressing together the second electrode portion of the one substrate and the first electrode portion of the other substrate, and plastically deforming and heating the first electrode portion to melt the molten metal.

In the above description, the core pattern is made of an inorganic material such as Ni, Ti, W or ceramics, and the bump pattern and first electrode portion are made of Au, Cu or Al.

In the above description, the core pattern is made of an inorganic material such as Ni, Ti, W or ceramics, and the first electrode portion is made of Au, Cu or Al.

In the above description, a projection is formed on the end surface of the core pattern.

A method of producing an electronic part of the present invention comprises, during fabrication of an electronic part, in which a bonding substrate is bonded to a device substrate formed with a functional portion so as to cover the device substrate while forming a gap therebetween, forming a second electrode portion on either one of the device substrate and the bonding substrate, the second electrode portion having a core pattern protruding towards the other substrate and a bump pattern having electrical conductivity and hardness lower than that of the core pattern and covering the surface of the core pattern, forming a first electrode portion of the same material as the bump pattern at a location of the other substrate corresponding to the second electrode portion, and electrically connecting the first electrode portion and the second electrode portion by plastically deforming the bump pattern and the first electrode portion by pressing together the second electrode portion of the one substrate and the first electrode portion of the other substrate, together with directly bonding the first electrode portion and the bump pattern.

In addition, a method of producing an electronic part of the present invention comprises, during fabrication of an electronic part, in which a bonding substrate is bonded to a device substrate formed with a functional portion so as to cover the device substrate while forming a gap therebetween, forming a second electrode portion on either one of the device substrate and the bonding substrate, the second electrode portion having a core pattern protruding towards the other substrate and a molten metal serving as a bump pattern having electrical conductivity and hardness lower than that of the core pattern and covering the surface of the core pattern, forming a first electrode portion at a location of the other substrate corresponding to the second electrode portion, and electrically connecting the first electrode portion and the second electrode portion by solidifying the molten metal after plastically deforming the molten metal and the first electrode portion by pressing together the second electrode portion of the one substrate and the first electrode portion of the other substrate, together with heating and melting the molten metal.

In the above description, surface roughness B of the bump pattern is greater than surface roughness A of the core pattern.

In the above description, surface roughness Ra of the second electrode portion is such that Ra>1 µm.

In the above description, the height of the core pattern is 1 to 30 µm.

In the above description, the thickness of the bump pattern is 0.1 to 5 µm.

In the above description, a core pattern in which a projection is formed on the end surface thereof is used for the core pattern.

According to this configuration, an accurate gap can be formed between opposing substrates, and the area of the electronic part can be reduced.

DESCRIPTION OF THE PREFERRED EMBODIMENTS

The following provides an explanation of respective embodiments of the present invention based on FIGS. 1A, 1B and 1C to 9.

First Embodiment

FIGS. 1A to 1C and FIG. 2 show a first embodiment of the present invention.

Figure 1A:
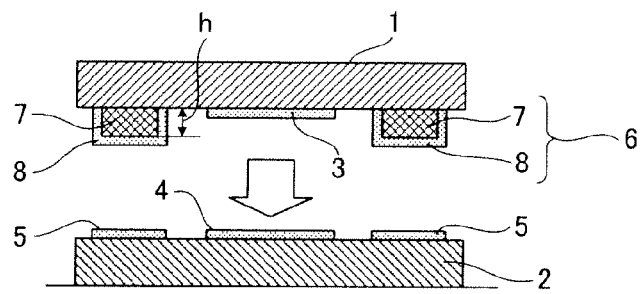
FIG. 1A is a cross-sectional view of a first embodiment of the present invention prior to clamping.
Figure 1B:
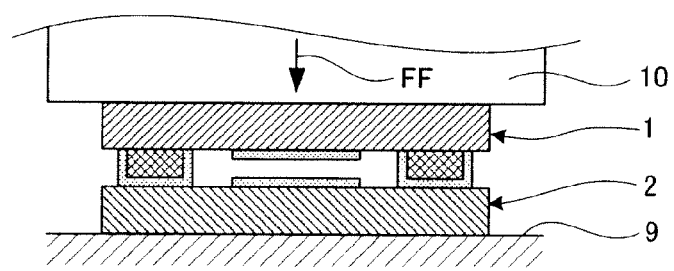
FIG. 1B is a cross-sectional view of a clamping step of the same embodiment.
Figure 1C:
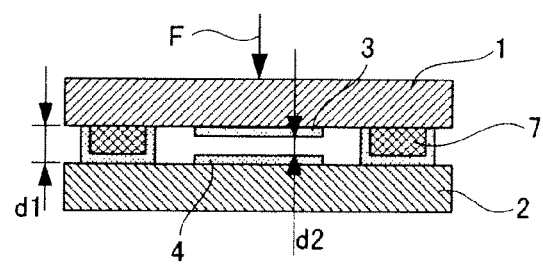
FIG. 1C is a cross-sectional view of the same embodiment following clamping.

An electronic part shown in FIG. 1C has a device substrate 1, on which a functional portion is formed, and a bonding substrate 2 bonded together so as to cover each other with a gap d1 therebetween. Furthermore, the functional portion refers to a portion that functions so that the gap d1 changes as a result of applying a force or voltage and the like. More specifically, this electronic part is an electrostatic capacitance detecting type of sensor, and the functional portion is composed such that the central portion of the device substrate 1 is elastically deformed by the action of a force F, and a gap d2 changes between a first detecting electrode 3 provided on the device substrate 1 and a second detecting electrode 4 provided on the bonding substrate 2.

Figure 2:
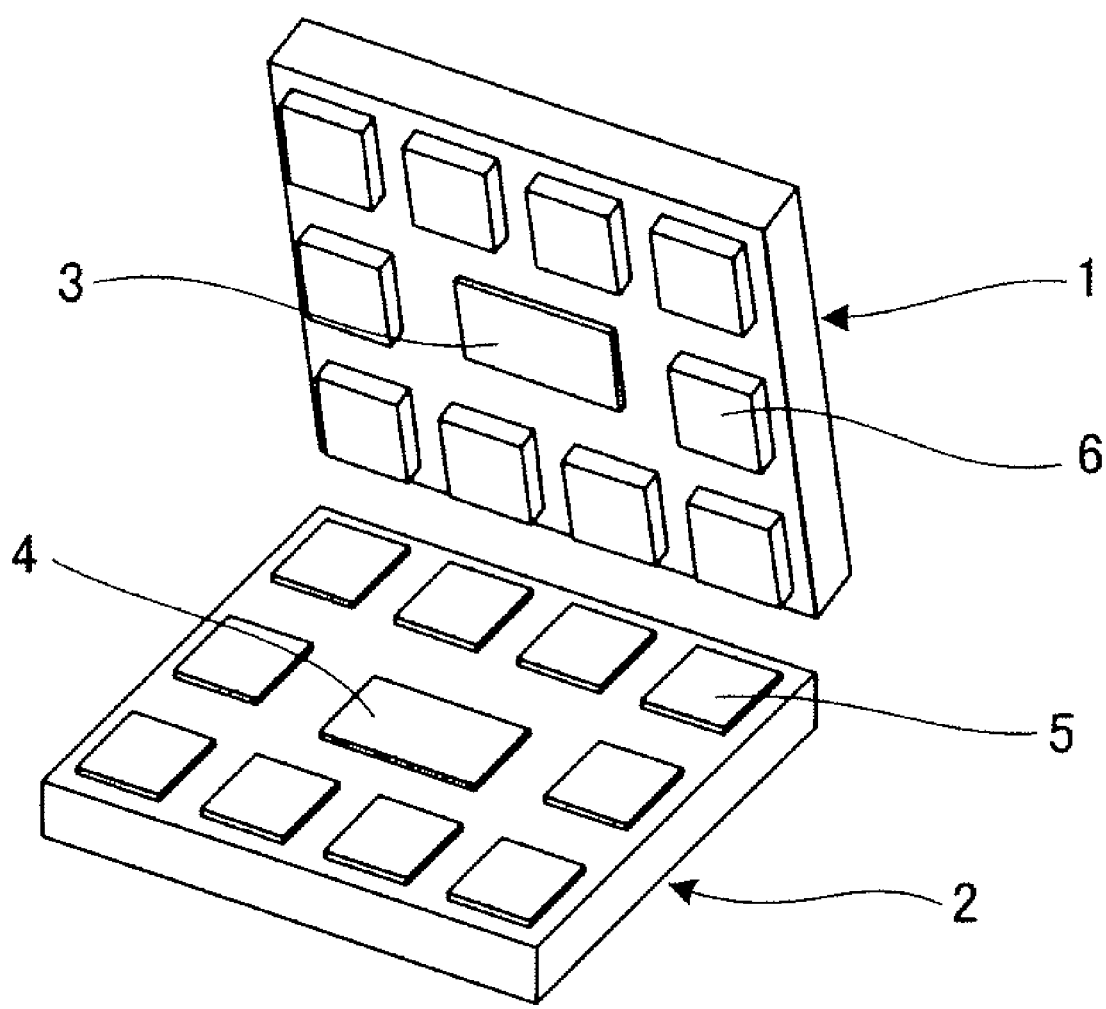
FIG. 2 is an exploded perspective view of the same embodiment.

As shown in FIG. 1A and FIG. 2, a first electrode portion 5 is formed on the bonding substrate 2. A second electrode portion 6 is formed on the device substrate 1 corresponding to the location of the first electrode portion 5 as shown in FIG. 1A and FIG. 2.

The second electrode portion 6 is formed from a core pattern 7 protruding towards the bonding substrate 2 and a bump pattern 8 covering the surface of the core pattern 7. The core pattern 7 is made of a material having hardness greater than that of the bump pattern 8. In the case of forming the first electrode portion 5 with Au, the bump pattern 8 is also formed with Au in the same manner as the first electrode portion 5, and Ni, for example, is used for the core pattern 7.

The height h of the core pattern 7 is 1 to 30 μm, and Au Serving as the bump pattern 8 is deposited by sputtering or plated On this core pattern 7 at a thickness of 0.1 to 5 μm. The thickness of the first electrode portion 5 is 0.1 to 5 μm.

The first detecting electrode 3 is electrically connected to the second electrode portion 6 by means of a wiring pattern (not shown). The second detecting electrode 4 is electrically connected to the first electrode portion 3 by means of a wiring pattern (not shown).

When the device substrate 1 and bonding substrate 2 formed in this manner are clamped at a load FF while clamped between a table 9 and a clamping jig 10 as shown in FIG. 1B, together with the first electrode portion 5 and the bump pattern 8 of the second electrode portion 6 of the device substrate 1 undergoing plastic deformation, the first electrode portion 5 and bump pattern 8 of the similar metal materials undergo direct bonding.

Since the hardness of Ni of the core pattern 7 is 5 to 10 times greater than that of Au (Ni: 500 to 600 HV, Au: 30 to 50 HV), there is little variation in the gap d1 as a result of suitably controlling the load FF within a range of conditions under which Ni is unlikely to be deformed.

Ni is a particularly suitable material for the core pattern 7 since it is inexpensive, is harder than Au and can be formed easily.

In this manner, since the gap d1 between the device substrate 1 and bonding substrate 2 demonstrates satisfactory accuracy, and there is little variation in the gap d2 between the first detecting electrode 3 and second detecting electrode 4, electrostatic capacitance is stable, thereby making it possible to prevent variations in characteristics of the electronic part and reduce production cost.

Second Embodiment

Figure 3A:
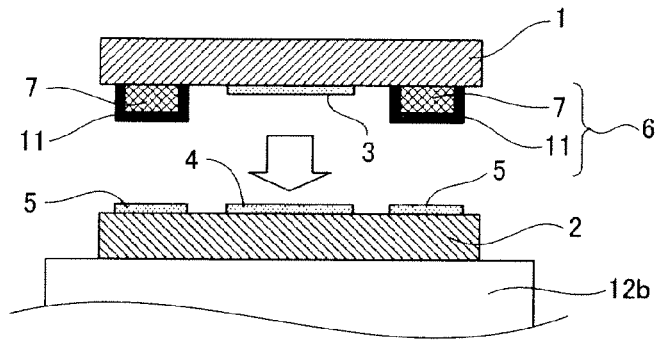
FIG. 3A is a cross-sectional view of a second embodiment of the present invention prior to clamping.
Figure 3B:
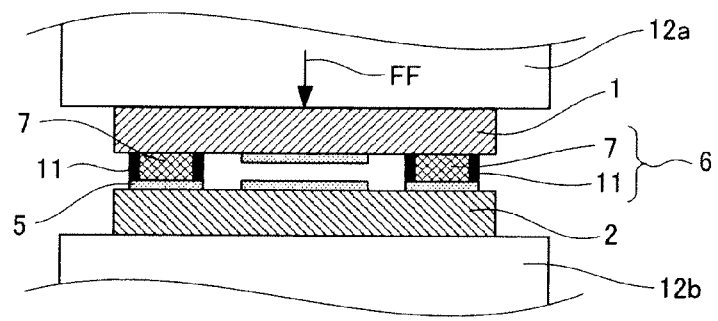
FIG. 3B is a cross-sectional view of a clamping step of the same embodiment.
Figure 3C:
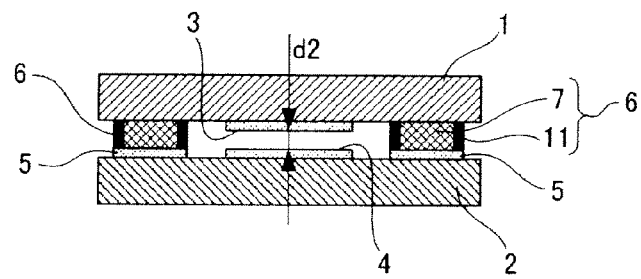
FIG. 3C is a cross-sectional view of the same embodiment following clamping.

FIGS. 3A, 3B and 3C show a second embodiment of the present invention.

Although Au was used for both the first electrode portion 5 and the bump pattern 8 and both were subjected to direct bonding in the first embodiment, this second embodiment differs from the first embodiment only in that a molten metal 11 such as solder is formed as a bump pattern 8 on the Ni of a core pattern 7 as shown in FIG. 3A.

When a device substrate 1 and a bonding substrate 2 formed in this manner are clamped between clamping jigs 12a and 12b provided with a heating apparatus as shown in FIG. 3B, and then heated to a temperature equal to or higher than the melting point of the molten metal 11 together with clamping with a load FF, together with the Au of a first electrode portion 5 undergoing plastic deformation, the molten metal 11 becomes a liquid, thereby making it possible to absorb variations in pattern height during bonding and realize stable, high-quality bonding. When cooled while in this state, the molten metal 11 solidifies, the device substrate 1 and bonding substrate 2 are bonded, and electrical continuity is achieved between the molten metal 11, first electrode portion 5 and core pattern 7. The finished product is shown in FIG. 3C.

In this embodiment as well, there is little variation in a gap d2 between a first detecting electrode 3 and a second detecting electrode 4 and electrostatic capacitance is stable, thereby making it possible to prevent variations in characteristics of the electronic part and reduce production cost.

Third Embodiment

Figure 4A:
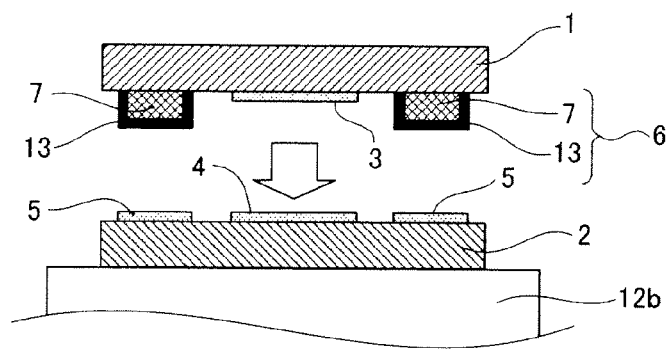
FIG. 4A is a cross-sectional view of a third embodiment of the present invention prior to clamping.
Figure 4B:
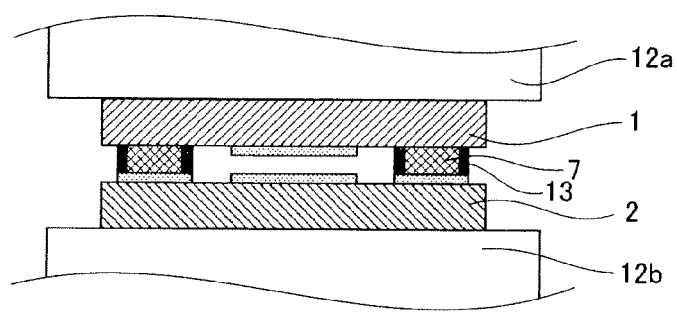
FIG. 4B is a cross-sectional view of a clamping step of the same embodiment.
Figure 4C:
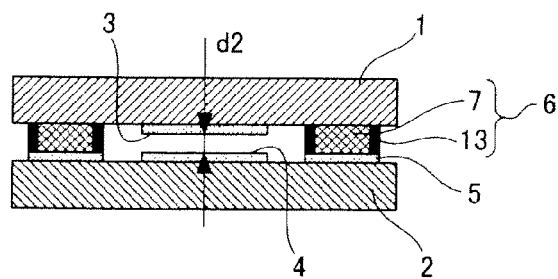
FIG. 4C is a cross-sectional view of the same embodiment following clamping.

FIGS. 4A, 4B and 4C show a third embodiment of the present invention.

Although Au was used for both the first electrode portion 5 and the bump pattern 8 and both were bonded by direct bonding in the first embodiment, this third embodiment differs only in that an electrically conductive adhesive 13, such as a paste in which a fine metal powder such as Ag, Cu or Au is dispersed in an adhesive, is formed as a bump pattern 8 on the Ni of a core pattern 7 as shown in FIG. 4A.

When a device substrate 1 and a bonding substrate 2 formed in this manner are clamped between clamping jigs 12a and 12b provided with a heating apparatus as shown in FIG. 4B, and then heated to a temperature equal to or higher than the curing temperature of the electrically conductive adhesive 13 together with clamping with load FF, together with the Au of a first electrode portion 5 undergoing plastic deformation, the electrically conductive adhesive 13 is heat-cured, the device substrate 1 and bonding substrate 2 are bonded, and electrical continuity is achieved between the electrically conductive adhesive 13, first electrode portion 5 and core pattern 7. The finished product is shown in FIG. 4C.

In this embodiment as well, there is little variation in a gap d2 between a first detecting electrode 3 and a second detecting electrode 4 and electrostatic capacitance is stable, thereby making it possible to prevent variations in characteristics of the electronic part and reduce production cost.

Fourth Embodiment

Figure 5A:
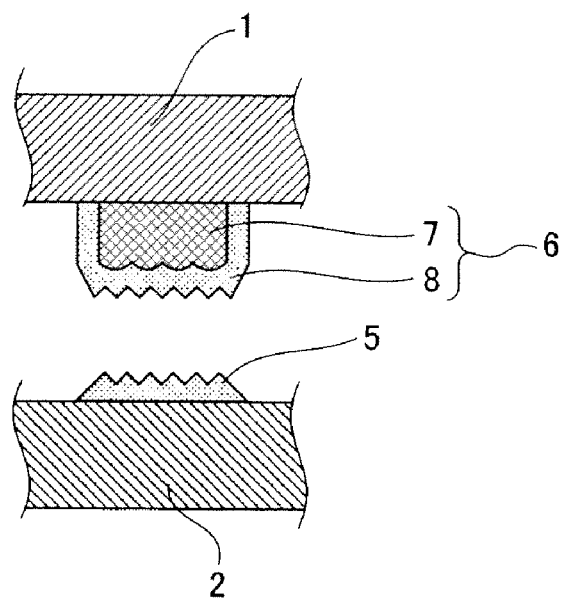
FIG. 5A is an enlarged view of the essential portion of a fourth embodiment of the present invention prior to bonding.
Figure 5B:
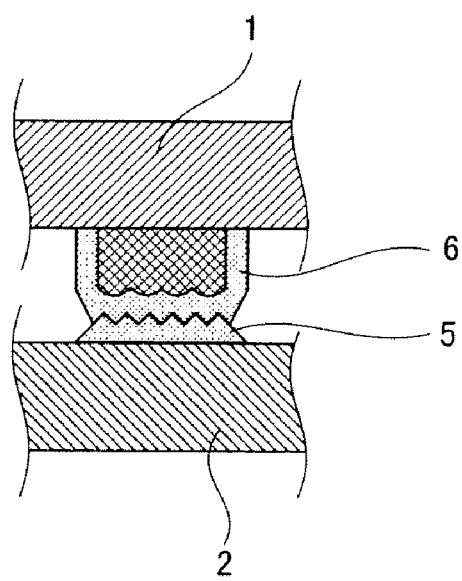
FIG. 5B is an enlarged view of the essential portion of the same embodiment following bonding.

FIGS. 5A and 5B show a fourth embodiment of the present invention.

This fourth embodiment indicates a specific step for forming the bump pattern 8 on the surface of the core pattern 7 in the first embodiment.

As shown in FIG. 5A, in the case of defining the surface roughness of the core pattern 7 as A and the surface roughness of the bump pattern 8 as B1, improvement of bonding quality by ensuring an accurate gap d2 and improving contact probability can be realized by pressing as shown in FIG. 5B after having adjusted the surface roughness such that: "surface roughness B1>surface roughness A".

More specifically, by forming the bump pattern 8 so as to have surface irregularities in the form of surface roughness B1 of 1 μm or more by adjusting setting of plating conditions when plating Au on Ni core pattern 7 having surface roughness A of less than 1 μm, or by roughing the bump pattern 8 following formation thereof by physically grinding so as to have surface irregularities of 1 μm or more, bonding probability can be improved by increasing contact surface area and improvement of bonding quality can be stabilized as a result of lowering the deformation load by increasing the aspect ratio.

Furthermore, similar effects are obtained by using surface roughness B2 of a first electrode 5 instead of the bump pattern 8, and making "surface roughness B2>surface roughness A" or by making "surface roughness B1>surface roughness A" and "surface roughness B2>surface roughness A".

Fifth Embodiment

FIGS. 6A, 6B, 6C and FIGS. 7A and 7B indicate a fifth embodiment of the present invention.

Figure 6A:
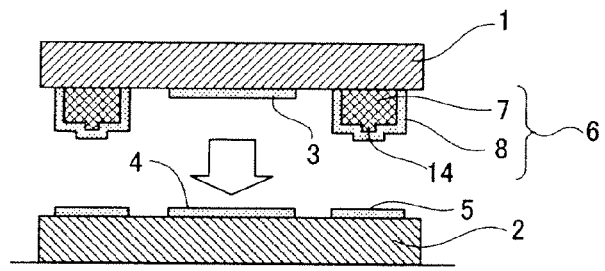
FIG. 6A is a cross-sectional view of a fifth embodiment of the present invention prior to clamping.
Figure 7A:
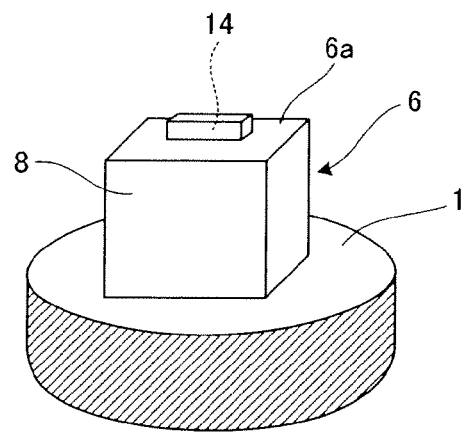
FIG. 7A is an enlarged perspective view of a second electrode portion of the same embodiment.
Figure 7B:
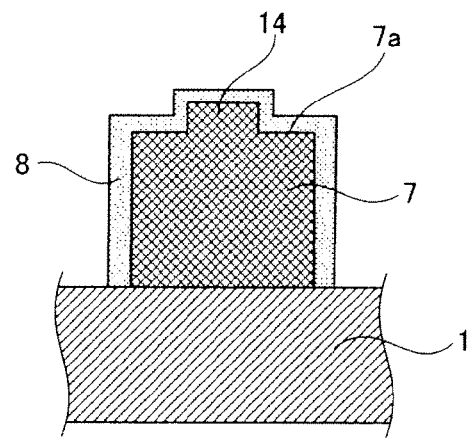
FIG. 7B is a cross-sectional view of the second electrode portion of the same embodiment.

Although the end surface of the core pattern 7 was flat in the first embodiment, this fifth embodiment differs only in that Ni is formed such that a projection 14 is formed on an end surface 7a of core pattern 7 as shown in FIGS. 6A and 7B.

Figure 6B:
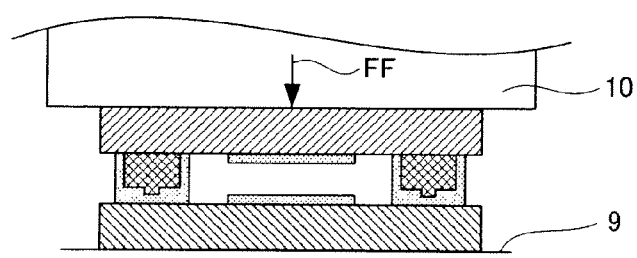
FIG. 6B is a cross-sectional view of a clamping step of the same embodiment.
Figure 6C:
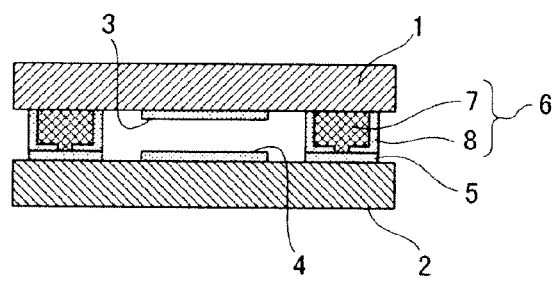
FIG. 6C is a cross-sectional view of the same embodiment following clamping.

When a bonding substrate 2 and a device substrate 1, in which the surface of Ni core pattern 7 with the projection 14 formed on an end surface thereof is covered with Au bump pattern 8 as shown in FIGS. 6A, 7A and 7B, are clamped with a load FF by clamping between a table 9 and a clamping jig 10 as shown in FIG. 6B, since bonding load is applied to the surface area of the projection 14, pressure becomes higher as compared with that in the first embodiment even if the load FF is the same, thereby allowing obtaining of adequate contact by the bonding electrodes and obtaining of satisfactory bonding quality. The finished product is shown in FIG. 7C.

In addition, even if the bonding substrate 2 is slightly warped, bonding quality having a wide tolerance can be obtained since deformation margin of a first electrode portion 5 is large.

In addition, even in the case of the second embodiment in which a molten metal is employed for the bump pattern 8, formation of a projection 14 on the end surface of the core pattern 7 can be similarly carried out. In this case, since an area can be created in the bonding region in which the molten metal is adequately present, strain caused by heat stress and the like from the outside can be absorbed, thereby allowing obtaining of highly reliable bonding quality.

Sixth Embodiment

Figure 8A:
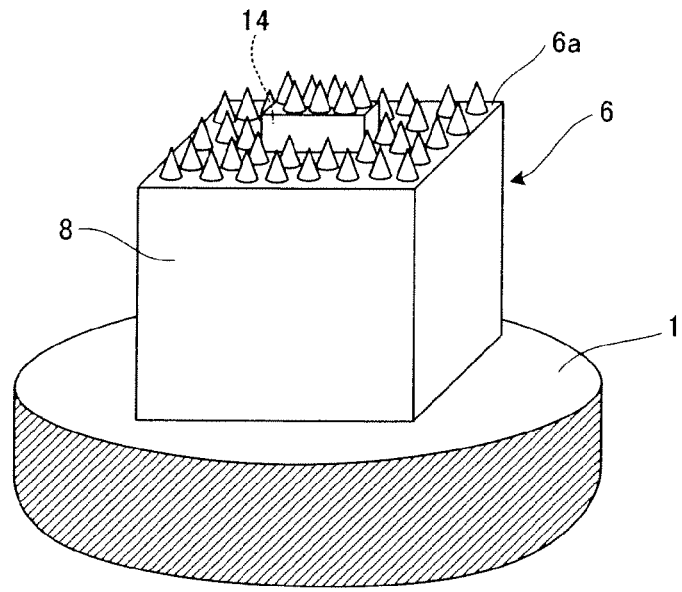
FIG. 8A is an enlarged perspective view of a second electrode portion of a sixth embodiment of the present invention.
Figure 8B:
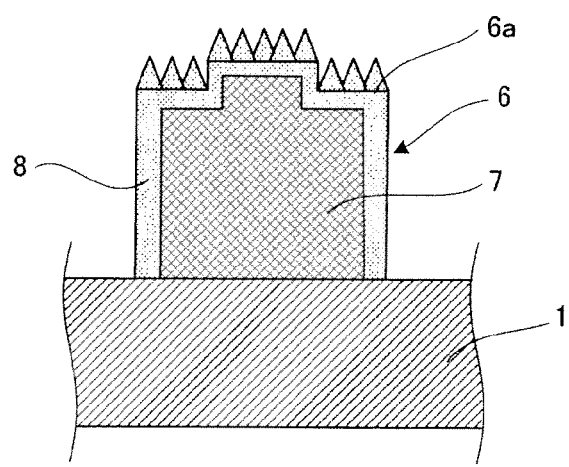
FIG. 8B is a cross-sectional view of the second electrode portion of the sixth embodiment of the present invention.

FIGS. 8A and 8B show a sixth embodiment of the present invention.

Contact probability can be further increased as a result of increasing the contact surface area with the first electrode portion 5 by roughening the end surface of the second electrode portion 6 shown in FIGS. 7A and 7B of the fifth embodiment.

Seventh Embodiment

Figure 9:
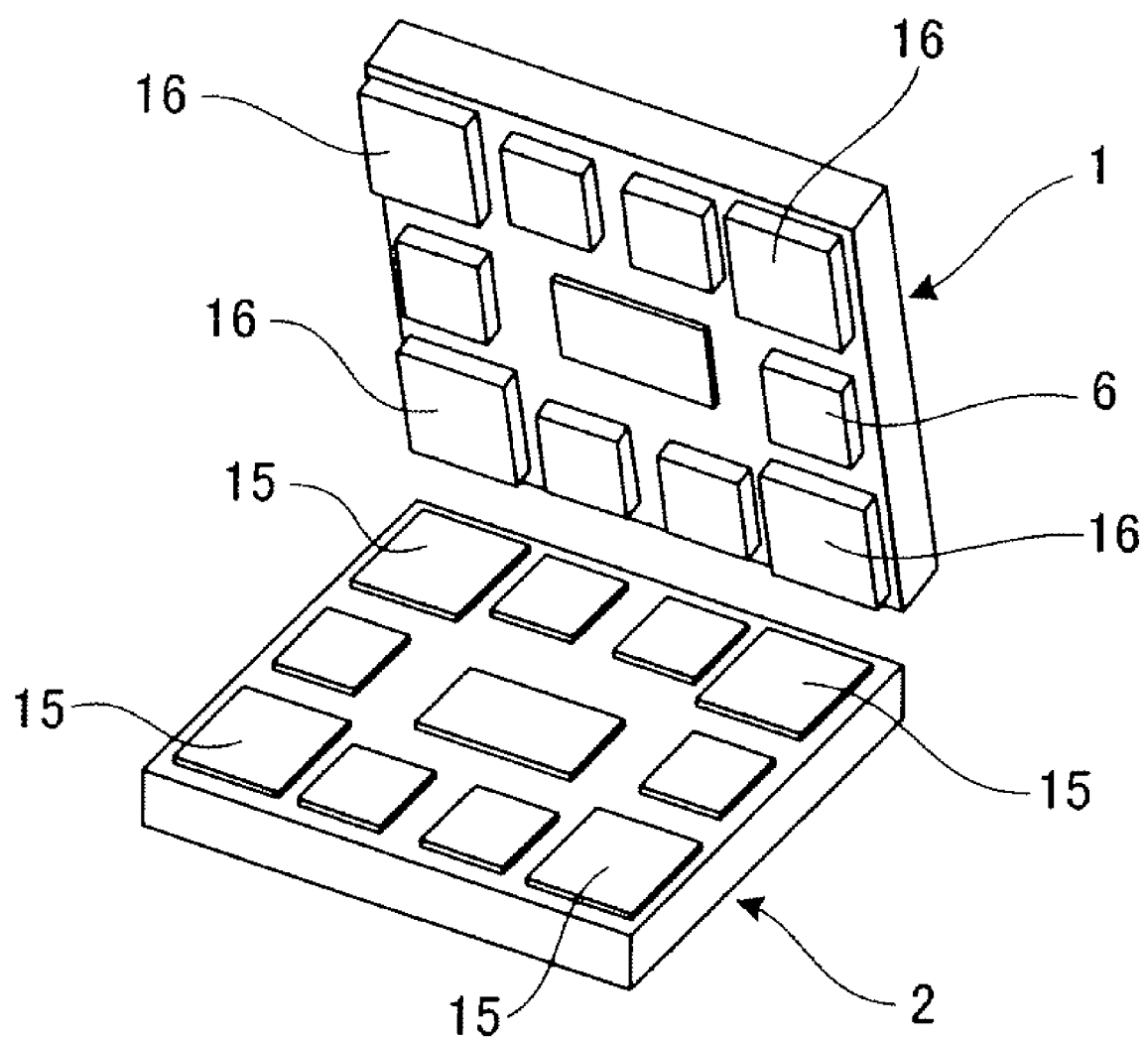
FIG. 9 is an exploded perspective view of an electronic part of a seventh embodiment of the present invention.
Figure 10:
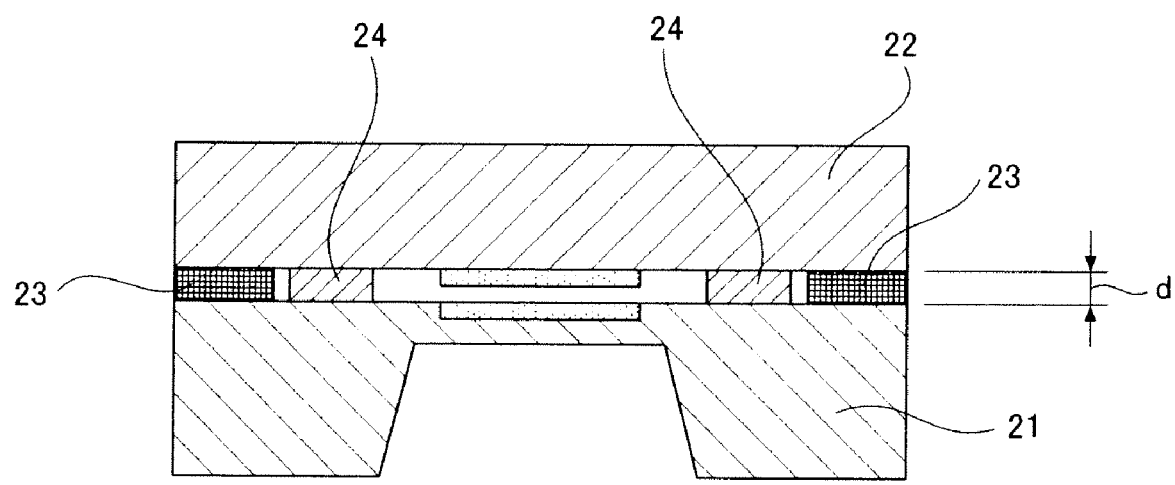
FIG. 10 is a cross-sectional view of an electronic part of the prior art.

FIG. 9 shows a seventh embodiment of the present invention.

Although the size of the first and second electrode portions 5 and 6 in each of the above-mentioned embodiments was of a single size in the bonding substrate 2 and device substrate 1 as shown in FIG. 2, by making corner electrodes 15 and 16 of first and second electrode portions 5 and 6 arranged in the form of a ring along the edges of a bonding substrate 2 and a device substrate 1 larger than the remaining electrodes as shown in the exploded view of FIG. 9, a structure can be realized that is able to withstand the generation of stress caused by thermal changes and the like from the outside following bonding.

Although each of the above-mentioned embodiments has been explained using the case of the combination of Au for the bump pattern 8 and Ni for the core pattern 7 as an example thereof, as another specific example thereof, Cu or Al can be used for the bump pattern 8, while Ti, W or an inorganic material such as ceramics can be used for the core pattern 7.

Although each of the embodiments has been explained using as an example thereof the case of providing the second electrode portion 6 formed from the core pattern 7 and bump pattern 8 on the device substrate 1 among the device substrate 1 and bonding substrate 2, the second electrode portion 6 formed from the core pattern 7 and the molten metal 11 serving as the bump pattern 8, or the second electrode portion 6 formed from the core pattern 7 and the electrically conductive adhesive 13 serving as the bump pattern 8, and providing the first electrode portion 5 on the bonding substrate 2, a configuration can also be employed in which a second electrode portion 6 is provided on a bonding substrate 2 and a first electrode portion 5 is provided on a device substrate 1.

Although each of the embodiments has been explained using as an example thereof the case of an electrostatic capacitance sensor that detects a change in the status of the gap d1, the embodiments can be similarly carried out in an actuator, for example, that changes the gap d2 corresponding to a current or voltage. A specific example of an actuator is an optical modulator that moves the position of a mirror due to a change in the gap d2.

Furthermore, the contact surface of the second electrode portion with the bonding substrate shown in the first to seventh embodiments is not limited to the square shape shown in FIG. 2, but rather the contact surface of the second electrode portion with the bonding substrate may also be rectangular, for example. More specifically, a total of four second electrode portions having rectangular contact surfaces may be provided, with one electrode portion being provided on one side of a quadrangular substrate.

The present invention is able to contribute to reduced size and improved reliability of various types of sensor devices and other electronic parts using high-precision mounting.

What is claimed is:

1. A method of producing an electronic part, during which a bonding substrate is bonded to a device substrate having a functional portion, to cover the device substrate while forming a gap therebetween, the method comprising:
   providing one of a device substrate and a bonding substrate as a first substrate and the other as a second substrate, and forming a second electrode portion on the second substrate, the second electrode portion having a core pattern protruding towards the first substrate and a bump pattern having an electrical conductivity and a hardness lower than those of the core pattern and covering a surface of the core pattern, wherein surface roughness B of the bump pattern is greater than surface roughness A of the core pattern,
   forming a first electrode portion of the same material as the bump pattern at a location of the first substrate corresponding to the second electrode portion, and
   electrically connecting the first electrode portion and the second electrode portion by plastically deforming the bump pattern and the first electrode portion by pressing together the second electrode portion of the second substrate and the first electrode portion of the first substrate, together with directly bonding the first electrode portion and the bump pattern.

2. The method of producing an electronic part according to claim 1, wherein surface roughness Ra of the second electrode portion is such that Ra>1 μm.

3. The method of producing an electronic part according to claim 1, wherein a height of the core pattern is 1 to 30 μm.

4. The method of producing an electronic part according to claim 1, wherein a thickness of the bump pattern is 0.1 to 5 μm.

5. A method of producing an electronic part, during which a bonding substrate is bonded to a device substrate having a functional portion, to cover the device substrate while forming a gap therebetween, the method comprising:
   providing one of a device substrate and a bonding substrate as a first substrate and the other as a second substrate, and forming a second electrode portion on the second substrate, the second electrode portion having a core pattern protruding towards the first substrate and a bump pattern being a molten metal having an electrical conductivity and a hardness lower than those of the core pattern and covering a surface of the core pattern,
   forming a first electrode portion at a location of the first substrate corresponding to the second electrode portion, and
   electrically connecting the first electrode portion and the second electrode portion by solidifying the molten metal after plastically deforming the molten metal and the first electrode portion by pressing together the second electrode portion of the second substrate and the first electrode portion of the first substrate, together with heating and melting the molten metal,
   wherein a height of the core pattern is 1 to 30 μm.

6. The method of producing an electronic part according to claim 5, wherein
   surface roughness Ra of the second electrode portion is such that Ra>1 μm.

7. The method of producing an electronic part according to claim 5, wherein
   a thickness of the bump pattern is 0.1 to 5 μm.

8. The method of producing an electronic part according to claim 5, wherein
   a projection is formed on an end surface of the core pattern.

9. A method of producing an electronic part, during which a bonding substrate is bonded to a device substrate having a functional portion, to cover the device substrate while forming a gap therebetween, the method comprising:
   providing one of a device substrate and a bonding substrate as a first substrate and the other as a second substrate, and forming a second electrode portion on the second substrate, the second electrode portion having a core pattern protruding towards the first substrate and a bump pattern having an electrical conductivity and a hardness lower than those of the core pattern and covering a surface of the core pattern,
   forming a first electrode portion of the same material as the bump pattern at a location of the first substrate corresponding to the second electrode portion, and
   electrically connecting the first electrode portion and the second electrode portion by plastically deforming the bump pattern and the first electrode portion by pressing together the second electrode portion of the second substrate and the first electrode portion of the first substrate, together with directly bonding the first electrode portion and the bump pattern, wherein
   a projection is formed on an end surface of the core pattern.

10. The method of producing an electronic part according to claim 9, wherein surface roughness Ra of the second electrode portion is such that Ra>1 μm.

11. The method of producing an electronic part according to claim 9, wherein a height of the core pattern is 1 to 30 μm.

12. The method of producing an electronic part according to claim 9, wherein a thickness of the bump pattern is 0.1 to 5 μm.

* * * * *